(12) United States Patent
Miao et al.

(10) Patent No.: US 11,821,932 B2
(45) Date of Patent: Nov. 21, 2023

(54) PARTIAL DISCHARGE (PD) DETECTION APPARATUS FOR GAS-INSULATED EQUIPMENT

(71) Applicant: Wuxi Power Supply Branch of State Grid Jiangsu Electric Power Co., Ltd., Jiangsu (CN)

(72) Inventors: Jin Miao, Jiangsu (CN); Ping Chen, Jiangsu (CN); Yin Gu, Jiangsu (CN); Bin Fei, Jiangsu (CN); Xi Wu, Jiangsu (CN); Haiping Shen, Jiangsu (CN); Fen Huang, Jiangsu (CN); Zhaoyun Leng, Jiangsu (CN); Xinyang Zhou, Jiangsu (CN); Junfeng Wu, Jiangsu (CN); Jiefeng Wan, Jiangsu (CN)

(73) Assignee: Wuxi Power Supply Branch of State Grid Jiangsu Electric Power Co., Ltd., Wuxi (CN)

( * ) Notice: Subject to any disclaimer, the term of this patent is extended or adjusted under 35 U.S.C. 154(b) by 275 days.

(21) Appl. No.: 17/606,088

(22) PCT Filed: Jul. 7, 2021

(86) PCT No.: PCT/CN2021/105076
§ 371 (c)(1),
(2) Date: Oct. 25, 2021

(87) PCT Pub. No.: WO2022/077965
PCT Pub. Date: Apr. 21, 2022

(65) Prior Publication Data
US 2022/0308105 A1    Sep. 29, 2022

(30) Foreign Application Priority Data

Oct. 13, 2020   (CN) .......................... 202011090905.4

(51) Int. Cl.
*G01R 31/12*    (2020.01)

(52) U.S. Cl.
CPC ...... *G01R 31/1254* (2013.01); *G01R 31/1218* (2013.01); *G01R 31/1272* (2013.01)

(58) Field of Classification Search
CPC ............ G01R 31/1254; G01R 31/1218; G01R 31/1272
See application file for complete search history.

(56) References Cited

U.S. PATENT DOCUMENTS 6,476,396 B1 * 11/2002 Forsyth ..................... G01J 1/42
                                                                 324/536
9,291,494 B1    3/2016 Piesinger
(Continued)

FOREIGN PATENT DOCUMENTS

CN      103105567 A    5/2013
CN      103424673 A    12/2013
(Continued)

*Primary Examiner* — Gary L Laxton

(57) ABSTRACT

A partial discharge (PD) detection apparatus for gas-insulated equipment includes a photon collector, an optical splitter, a first photoelectric conversion module, an ultraviolet fluorescent crystal, a second photoelectric conversion module, and a signal processing module, where the ultraviolet fluorescent crystal is configured to convert a second optical radiation signal into an optical radiation signal of an ultraviolet fluorescence band, and the signal processing module is configured to calculate first apparent intensity based on a first voltage signal output by the first photoelectric conversion module, calculate second apparent intensity based on a second voltage signal output by the second photoelectric conversion module, and determine discharge intensity of the optical radiation based on a ratio of the second apparent intensity to the first apparent intensity. Technical solutions of the present disclosure are not affected by an unknown distance between a discharge position and a detection point.

18 Claims, 2 Drawing Sheets

(56) References Cited

U.S. PATENT DOCUMENTS

| | | | | |
|---|---|---|---|---|
| 2010/0163743 A1* | 7/2010 | Shong | .................. | G01J 1/02 |
| | | | | 250/372 |
| 2010/0250159 A1* | 9/2010 | Hall | .................. | G01R 13/0254 |
| | | | | 702/60 |
| 2014/0233686 A1* | 8/2014 | Choi | .................. | G01N 29/4463 |
| | | | | 375/349 |
| 2016/0161543 A1* | 6/2016 | Andle | .................. | G01R 31/14 |
| | | | | 324/551 |

FOREIGN PATENT DOCUMENTS

| | | |
|---|---|---|
| CN | 203551723 U | 4/2014 |
| CN | 107064751 A | 8/2017 |
| CN | 111308289 A | 6/2020 |
| CN | 211148830 U | 7/2020 |

* cited by examiner

US 11,821,932 B2

PARTIAL DISCHARGE (PD) DETECTION APPARATUS FOR GAS-INSULATED EQUIPMENT

TECHNICAL FIELD

Embodiments of the present disclosure relate to the technical field of discharge monitoring, and in particular, to a partial discharge (PD) detection apparatus for gas-insulated equipment.

BACKGROUND

Gas-insulated equipment is widely used in a power system because of its advantages such as a compact structure, small floor area, high reliability, flexible configuration, convenient installation, strong safety, and a strong environmental adaptability.

An insulation fault of the gas-insulated equipment is usually caused by PD, so it is very important to perform discharge monitoring on the gas-insulated equipment. In the prior art, for conventional PD detection, it is difficult to evaluate the severity of a discharge fault with an unknown location because the detection distance seriously impacts the strength of a coupled signal especially for electromagnetic and acoustic detection.

SUMMARY

Embodiments of the present disclosure provide a PD detection apparatus for gas-insulated equipment, to improve accuracy of discharge degree calculation.

According to a first aspect, an embodiment of the present disclosure provides a PD detection apparatus for gas-insulated equipment, including a photon collector, an optical splitter, a first photoelectric conversion module, an ultraviolet fluorescent crystal, a second photoelectric conversion module, and a signal processing module, where the photon collector is configured to collect optical radiation caused by PD of gas-insulated equipment;
an input terminal of the optical splitter is connected to the photon collector in a contact manner, and the optical splitter is configured to divide the collected optical radiation into first optical radiation and second optical radiation;
an input terminal of the first photoelectric conversion module is connected to a first output terminal of the optical splitter by a connection element, and the first photoelectric conversion module is configured to convert a first optical radiation signal into a first voltage signal;
a first terminal of the ultraviolet fluorescent crystal is connected to a second output terminal of the optical splitter by a connection element, a second terminal of the ultraviolet fluorescent crystal is connected to an input terminal of the second photoelectric conversion module in the contact manner, the ultraviolet fluorescent crystal is configured to convert a second optical radiation signal into an optical radiation signal of an ultraviolet fluorescence band, and the second photoelectric conversion module is configured to convert the optical radiation signal of the ultraviolet fluorescence band into a second voltage signal; and
the signal processing module is electrically connected to an output terminal of the first photoelectric conversion module and an output terminal of the second photoelectric conversion module, and configured to calculate first apparent intensity of the first optical radiation based on the first voltage signal, calculate second apparent intensity of the second optical radiation based on the second voltage signal, and determine discharge intensity of the optical radiation based on a ratio of the second apparent intensity to the first apparent intensity.

Optionally, the first photoelectric conversion module includes a first condensing collimating mirror, a first photodiode, and a first amplifier;

an input terminal of the first condensing collimating mirror is connected to the first output terminal of the optical splitter by a connection element, and an output terminal of the first condensing collimating mirror is connected to a control terminal of the first photodiode by an optical fiber; and
a first terminal of the first photodiode is electrically connected to a first input terminal of the first amplifier, a second terminal of the first photodiode is electrically connected to a second input terminal of the first amplifier, the first photodiode is configured to convert the first optical radiation signal into a first photocurrent signal, and the first amplifier converts the first photocurrent signal into the first voltage signal.

Optionally, the second photoelectric conversion module includes a second condensing collimating mirror, a second photodiode, and a second amplifier;

an input terminal of the second condensing collimating mirror is connected to the second terminal of the ultraviolet fluorescent crystal in the contact manner, and an output terminal of the second condensing collimating mirror is connected to a control terminal of the second photodiode by an optical fiber; and
a first terminal of the second photodiode is electrically connected to a first input terminal of the second amplifier, a second terminal of the second photodiode is electrically connected to a second input terminal of the second amplifier, the second photodiode is configured to convert the optical radiation signal of the ultraviolet fluorescence band into a second photocurrent signal, and the second amplifier converts the second photocurrent signal into the second voltage signal.

Optionally, the second photodiode is an avalanche photodiode.

Optionally, both the first optical radiation and the second optical radiation are all-band optical radiation.

Optionally, the discharge intensity of the optical radiation is negatively correlated with the second apparent intensity.

Optionally, the photon collector includes a condensing lens and an optical conductor; and the optical conductor is disposed on a focal plane of the condensing lens.

Optionally, the optical conductor is a fused quartz optical conductor.

Optionally, the signal processing module includes an oscilloscope or an upper computer.

According to a second aspect, an embodiment of the present disclosure provides gas-insulated equipment. The gas-insulated equipment includes the PD detection apparatus for gas-insulated equipment in any embodiment of the present disclosure.

The PD detection apparatus for gas-insulated equipment provided in the embodiments of the present disclosure includes a photon collector, an optical splitter, a first photoelectric conversion module, an ultraviolet fluorescent crystal, a second photoelectric conversion module, and a signal processing module. The photon collector collects optical radiation caused by discharge inside gas-insulated equipment. The optical splitter divides the received optical radiation into first optical radiation and second optical radiation. The first optical radiation is incident into the first photoelectric conversion module and converted into a first voltage signal, and the second optical radiation is incident into the second photoelectric conversion module through the ultraviolet fluorescent crystal and converted into a second voltage signal. The signal processing module calculates first apparent intensity of the first optical radiation based on the first voltage signal, calculates second apparent intensity of the second optical radiation based on the second voltage signal, and determines discharge intensity of the optical radiation based on a ratio of the second apparent intensity to the first apparent intensity. Compared with the prior art, the technical solutions provided in the embodiments of the present disclosure determine the discharge intensity of the gas-insulated equipment based on the ratio of the first apparent intensity corresponding to the first optical radiation to the second apparent intensity corresponding to optical radiation, of the ultraviolet fluorescence band, converted from the second optical radiation. This is not affected by an unknown distance between a discharge position and a detection point, and further can improve detection precision of the discharge intensity.

DETAILED DESCRIPTION

The present disclosure is further described in detail below with reference to the accompanying drawings and embodiments. It may be understood that the specific embodiments described herein are merely intended to explain the present disclosure, rather than to limit the present disclosure. It should also be noted that, for convenience of description, only the parts related to the present disclosure are shown in the accompany drawings.

As described in the background art, most of detection systems capable of measuring a pulse of optical radiation caused by PD in the prior art use a vacuum field-effect photomultiplier as a photoelectric converter. The vacuum field-effect photomultiplier has a large volume and a high driving voltage and is difficult to be placed in a tested device. It is usually used for basic research of gas discharge in a laboratory and cannot be applied to practical engineering. In addition, a luminous flux set in the prior art is high. As a result, sensitivity of the detection system is reduced, and weak light during early PD of gas-insulated equipment cannot be detected. Generally, intensity of an optical signal obtained through photoelectric conversion is used as a basis for determining discharge intensity, which is greatly affected by a measurement distance. An unknown distance between a fault point and a detection point seriously affects calculation of PD intensity of the gas-insulated equipment.

Figure 1:
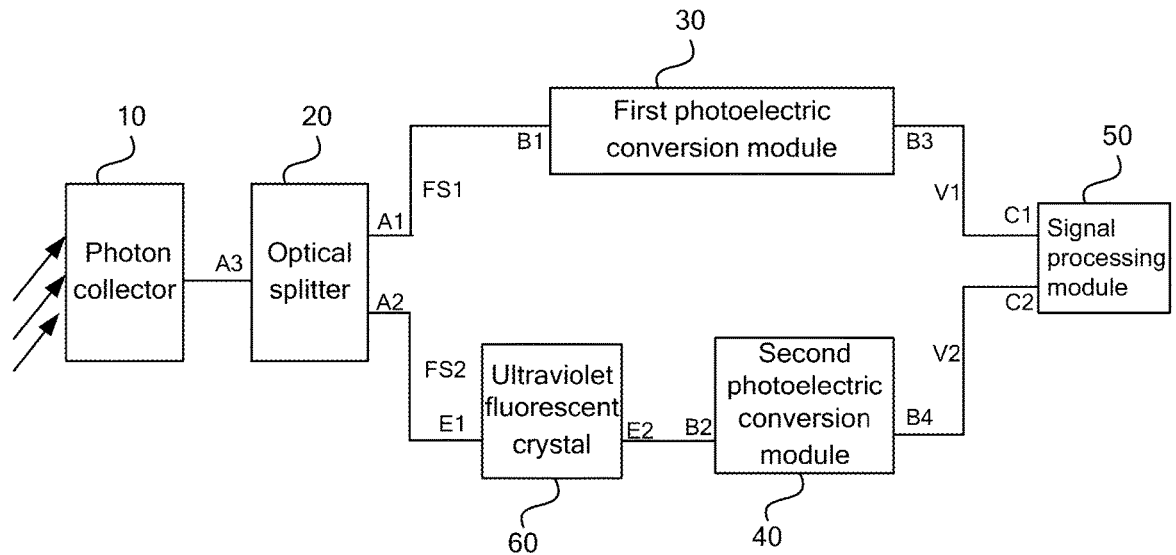
FIG. 1 is a schematic structural diagram of a PD detection apparatus for gas-insulated equipment according to an embodiment of the present disclosure.

In view of this, the embodiments of the present disclosure provide a PD detection apparatus for gas-insulated equipment. The apparatus may be disposed inside gas-insulated equipment to detect an insulation fault inside the gas-insulated equipment. FIG. 1 is a schematic structural diagram of a PD detection apparatus for gas-insulated equipment according to an embodiment of the present disclosure. As shown in FIG. 1, the PD detection apparatus for gas-insulated equipment in this embodiment of the present disclosure includes: a photon collector 10, an optical splitter 20, a first photoelectric conversion module 30, an ultraviolet fluorescent crystal 60, a second photoelectric conversion module 40, and a signal processing module 50. The photon collector 10 is configured to collect optical radiation caused by PD of gas-insulated equipment. An input terminal A3 of the optical splitter 20 is connected to the photon collector 10 in a contact manner, and the optical splitter 20 is configured to divide the collected optical radiation into first optical radiation and second optical radiation. An input terminal B1 of the first photoelectric conversion module 30 is connected to a first output terminal A1 of the optical splitter 20 by a connection element, and the first photoelectric conversion module 30 is configured to convert a first optical radiation signal FS1 into a first voltage signal V1. A first terminal E1 of the ultraviolet fluorescent crystal 60 is connected to a second output terminal A2 of the optical splitter 20 by a connection element, a second terminal E2 of the ultraviolet fluorescent crystal 60 is connected to an input terminal B2 of the second photoelectric conversion module 40 in the contact manner, and the ultraviolet fluorescent crystal 60 is configured to convert a second optical radiation signal FS2 into an optical radiation signal of an ultraviolet fluorescence band. The second photoelectric conversion module 40 is configured to convert the optical radiation signal of the ultraviolet fluorescence band into a second voltage signal V2.

The signal processing module 50 is electrically connected to an output terminal B3 of the first photoelectric conversion module 30 and an output terminal B4 of the second photoelectric conversion module 40, and configured to calculate first apparent intensity S1 of the first optical radiation based on the first voltage signal V1, calculate second apparent intensity S2 of the second optical radiation based on the second voltage signal V2, and determine discharge intensity of the optical radiation based on a ratio of the second apparent intensity S2 to the first apparent intensity S1.

Specifically, the gas-insulated equipment includes a gas-insulated switch, a gas-insulated transmission pipe gallery, a gas-insulated transformer, and the like. When a PD fault occurs inside the gas-insulated equipment, optical radiation will be caused by discharge and transmitted in a form of a photon or an electromagnetic wave. The photon collector 10 is disposed at a front end of the PD detection apparatus for gas-insulated equipment to collect the optical radiation. The optical radiation is input into the optical splitter 20 through the photon collector 10. The optical splitter 20 is connected to the photon collector 10 in a plane contact manner. The optical splitter 20 can divide the optical radiation collected by the photon collector 10 into two parts of optical radiation, namely, the first optical radiation and the second optical radiation, where bands of the first optical radiation and the second optical radiation are exactly the same. The first photoelectric conversion module 30 is connected to the first output terminal A1 of the optical splitter 20 by the connection element, where the connection element may be a C-type interface, and the first optical radiation output by the optical splitter 20 enters the first photoelectric conversion module 30. The first photoelectric conversion module 30 photoelectrically measures the received first optical radiation, converts the first optical radiation signal FS1 into the first voltage signal V1, and the signal processing module 50 calculates an average amplitude of the first voltage signal V1 in a preset period to obtain the first apparent intensity S1 of the first optical radiation. The second optical radiation output by the optical splitter 20 is incident into the ultraviolet fluorescent crystal 60. The ultraviolet fluorescent crystal 60 converts the second optical radiation signal FS2 into the optical radiation signal of the ultraviolet fluorescence band through fluorescence excitation. The second photoelectric conversion module 40 photoelectrically measures the received optical radiation signal of the ultraviolet fluorescence band, and converts the optical radiation signal of the ultraviolet fluorescence band into the second voltage signal V2. The signal processing module 50 calculates an average amplitude of the second voltage signal V2 in the preset period to obtain the second apparent intensity S2 of the second optical radiation. For example, the preset period may be ten cycles. The first optical radiation and the second optical radiation are converted into optical radiation of two bands by the first photoelectric conversion module 30 and the second photoelectric conversion module 40 respectively, and then the first voltage signal V1 and the second voltage signal V2 are generated based on a photoelectric effect. The signal processing module 50 uses the calculated second apparent intensity S2 and first apparent intensity S1 as a quotient to obtain the ratio S2/S1, and determines the discharge intensity of the optical radiation based on the ratio S2/S1.

The PD detection apparatus for gas-insulated equipment provided in this embodiment of the present disclosure includes a photon collector, an optical splitter, a first photoelectric conversion module, an ultraviolet fluorescent crystal, a second photoelectric conversion module, and a signal processing module. The photon collector collects optical radiation caused by discharge inside gas-insulated equipment. The optical splitter divides the received optical radiation into first optical radiation and second optical radiation. The first optical radiation is incident into the first photoelectric conversion module and converted into a first voltage signal, and the second optical radiation is incident into the second photoelectric conversion module through the ultraviolet fluorescent crystal and converted into a second voltage signal. The signal processing module calculates first apparent intensity of the first optical radiation based on the first voltage signal, calculates second apparent intensity of the second optical radiation based on the second voltage signal, and determines discharge intensity of the optical radiation based on a ratio of the second apparent intensity to the first apparent intensity. Compared with the prior art, the technical solutions provided in the embodiments of the present disclosure determine the discharge intensity of the gas-insulated equipment based on the ratio of the first apparent intensity corresponding to the first optical radiation to the second apparent intensity corresponding to optical radiation, of the ultraviolet fluorescence band, converted from the second optical radiation. This is not affected by an unknown distance between a discharge position and a detection point, and further can improve detection precision of the discharge intensity.

Figure 2:
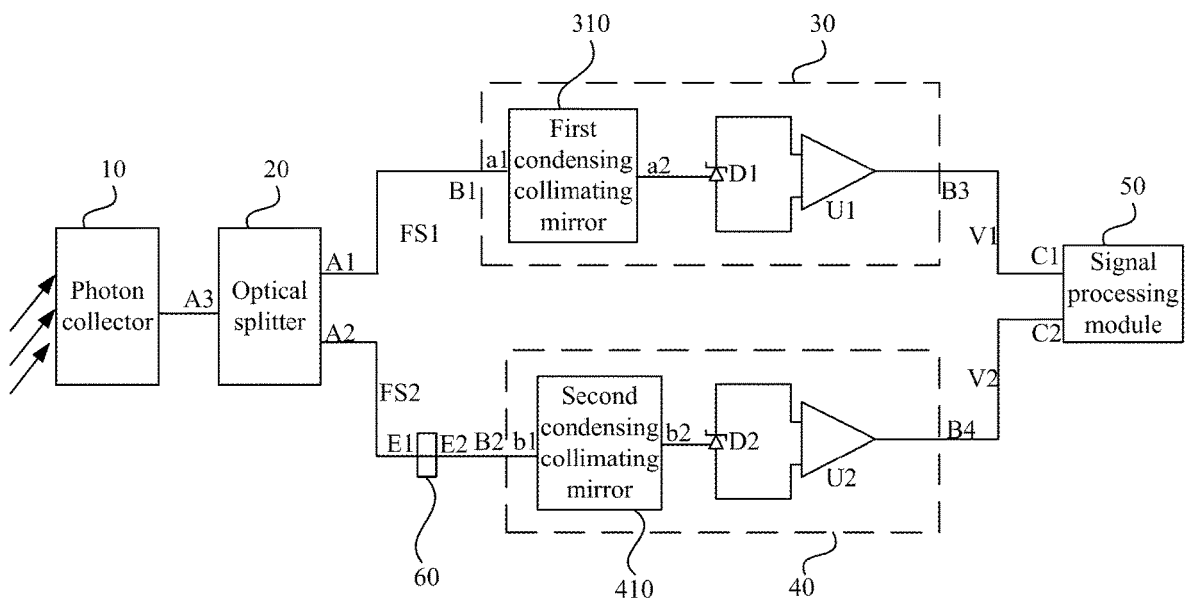
FIG. 2 is a schematic structural diagram of another PD detection apparatus for gas-insulated equipment according to an embodiment of the present disclosure.

Optionally, FIG. 2 is a schematic structural diagram of another PD detection apparatus for gas-insulated equipment according to an embodiment of the present disclosure. As shown in FIG. 2, based on the above technical solution, the first photoelectric conversion module 30 includes a first condensing collimating mirror 310, a first photodiode D1, and a first amplifier U1. An input terminal a1 of the first condensing collimating mirror 310 is connected to the first output terminal A1 of the optical splitter 20 by a connection element, and an output terminal a2 of the first condensing collimating mirror 310 is connected to a control terminal of the first photodiode D1 by an optical fiber.

A first terminal of the first photodiode D1 is electrically connected to a first input terminal of the first amplifier U1, a second terminal of the first photodiode D1 is electrically connected to a second input terminal of the first amplifier U1, the first photodiode D1 is configured to convert the first optical radiation signal FS1 into a first photocurrent signal, and the first amplifier U1 converts the first photocurrent signal into the first voltage signal V1.

Specifically, the first condensing collimating mirror 310 may be connected to the first output terminal A1 of the optical splitter 20 by the C-type interface. The first condensing collimating mirror 310 can converge the first optical radiation signal FS1 emitted by the optical splitter 20 into a beam of collimated light and make the beam of collimated light incident into the control terminal of the first photodiode D1 through the optical fiber. The first photodiode D1 can convert the first optical radiation signal FS1 into the first photocurrent signal. The first amplifier U1 converts the received first photocurrent signal into the first voltage signal V1 through current-to-voltage conversion, and amplifies the first voltage signal V1. The signal processing module calculates an average value of the first voltage signal V1 in the preset period based on the received first voltage signal V1 to obtain the first apparent intensity S1 of the first optical radiation. The preset period may be ten cycles.

As shown in FIG. 2, based on the above technical solutions, the second photoelectric conversion module 40 includes a second condensing collimating mirror 410, a second photodiode D2, and a second amplifier U2. An input terminal b1 of the second condensing collimating mirror 410 is connected to the second terminal E2 of the ultraviolet fluorescent crystal 60 in the contact manner, and an output terminal b2 of the second condensing collimating mirror 410 is connected to a control terminal of the second photodiode D2 by an optical fiber.

A first terminal of the second photodiode D2 is electrically connected to a first input terminal of the second amplifier U2, a second terminal of the second photodiode D2 is electrically connected to a second input terminal of the second amplifier U2, the second photodiode D2 is configured to convert the optical radiation signal of the ultraviolet fluorescence band into a second photocurrent signal, and the second amplifier U2 converts the second photocurrent signal into the second voltage signal V2.

Specifically, a specific working principle of the second photoelectric conversion module 40 is the same as that of the first photoelectric conversion module 30, and details are not described herein again.

Optionally, as shown in FIG. 2, based on the above technical solutions, the second photodiode D2 is an avalanche photodiode. Collimated beams output from the first condensing collimating mirror 310 and the second condensing collimating mirror 410 are incident into the first photodiode D1 and the second photodiode D2 respectively, and the first photodiode D1 and the second photodiode D2 photoelectrically measure the collimated beams of the two parts of optical radiation respectively. Both the first optical radiation and the second optical radiation are all-band optical radiation. The first optical radiation is directly incident into the first condensing collimating mirror 310, and the second optical radiation is converted into optical radiation of the ultraviolet fluorescence band by the ultraviolet fluorescent crystal 60 and incident into the second condensing collimating mirror 410. The Avalanche photodiode is a photosensitive element. After a reverse voltage is applied to a PN junction of the avalanche photodiode, optical radiation incident into the control terminal of the avalanche photodiode is absorbed by the PN junction to form a photocurrent. Increasing the reverse voltage can double the photocurrent. A best working band of the avalanche photodiode is a visible light band. In this embodiment of the present disclosure, the all-band second optical radiation signal is converted into the optical radiation signal of the ultraviolet fluorescence band through fluorescence excitation, so that a range of spectra detected by the avalanche photodiode is expanded. This can improve detection sensitivity of the optical radiation signal of the ultraviolet fluorescence band, and help improve accuracy of discharge degree calculation of the gas-insulated equipment. Optionally, the first photodiode D1 and the second photodiode D2 are Avalanche photodiodes.

Figure 3:
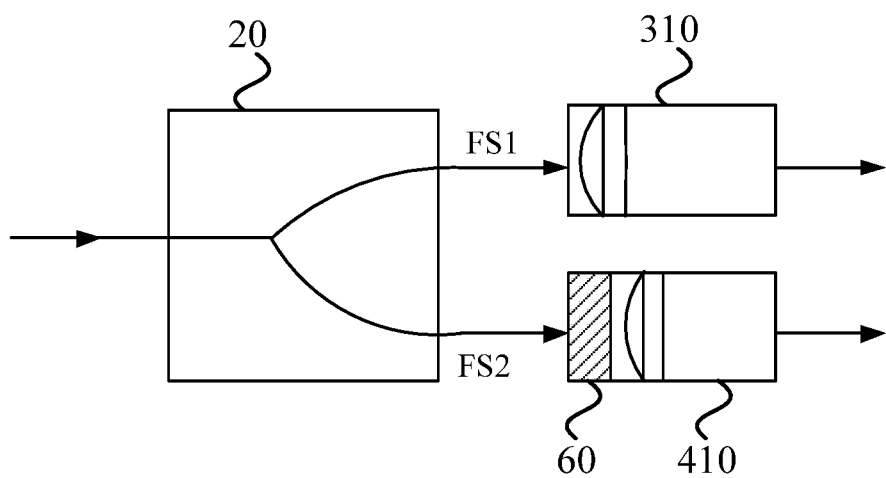
FIG. 3 is a schematic diagram of a partial structure of a PD detection apparatus for gas-insulated equipment according to an embodiment of the present disclosure.

Optionally, FIG. 3 is a schematic diagram of a partial structure of a PD detection apparatus for gas-insulated equipment according to an embodiment of the present disclosure. FIG. 3 specifically shows the optical splitter, the first condensing collimating mirror 310, the ultraviolet fluorescent crystal 60, and the second condensing collimating mirror 410. As shown in FIG. 2 and FIG. 3, the discharge intensity of the optical radiation is negatively correlated with the second apparent intensity S2. The first optical radiation output by the optical splitter 20 is incident into the first condensing collimating mirror 310, the collimated beam emitted by the first condensing collimating mirror 310 is incident into the first photodiode D1, the first photodiode D1 converts the first optical radiation signal FS1 into the first photocurrent signal, and the first amplifier U1 converts the received first photocurrent signal into the first voltage signal V1 through current-to-voltage conversion, and amplifies the first voltage signal V1. The signal processing module 50 includes an oscilloscope or an upper computer. The signal processing module 50 calculates the average value of the first voltage signal V1 in the preset period based on the received first voltage signal V1 to obtain the first apparent intensity S1 of the first optical radiation. The second optical radiation output by the optical splitter 20 is incident into the ultraviolet fluorescent crystal 60. The ultraviolet fluorescent crystal 60 converts the second optical radiation signal FS2 into the optical radiation signal of the ultraviolet fluorescence band through fluorescence excitation. The second photoelectric conversion module 40 photoelectrically measures the received optical radiation signal of the ultraviolet fluorescence band, and converts the optical radiation signal of the ultraviolet fluorescence band into the second voltage signal V2. The signal processing module 50 calculates the average amplitude of the second voltage signal V2 in the preset period to obtain the second apparent intensity S2 of the second optical radiation. The signal processing module 50 uses the calculated second apparent intensity S2 and first apparent intensity S1 as the quotient to obtain the ratio S2/S1, and determines the discharge intensity of the optical radiation based on the ratio S2/S1. A smaller ratio S2/S1 leads to higher discharge intensity of the gas-insulated equipment. In other words, the discharge intensity of the gas-insulated equipment can be determined based on apparent proportions of the optical radiation of the ultraviolet fluorescence band and the all-band optical radiation. A smaller apparent proportion of the optical radiation of the ultraviolet fluorescence band leads to a higher discharge intensity of the gas-insulated equipment. A specific value of the ratio may be determined based on different air pressures and gas types.

Figure 4:
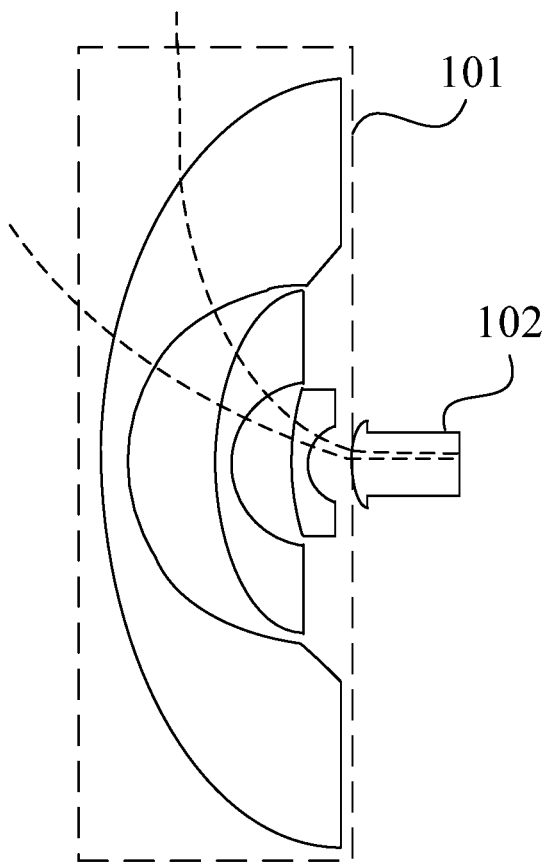
FIG. 4 is a schematic structural diagram of a photon collector according to an embodiment of the present disclosure.

Optionally, FIG. 4 is a schematic structural diagram of a photon collector according to an embodiment of the present disclosure. As shown in FIG. 4, based on the above technical solutions, the photon collector 10 includes a condensing lens 101 and an optical conductor 102. The optical conductor 102 is disposed on a focal plane of the condensing lens 101.

Specifically, the condensing lens 101 may be a fish-eye condensing lens. When the optical radiation is incident into the condensing lens 101, photons move along a curve and are converged on the focal plane of the condensing lens 101. Due to a unique structure of the fish-eye condensing lens, the photon collector 10 has a large field of view range inside the gas-insulated equipment, and therefore can better collect the optical radiation. The optical conductor 102 is configured to import the optical radiation collected by the condensing lens 101 into the optical splitter 20. The optical conductor 102 is disposed on the focal plane of the condensing lens 101, such that the optical radiation converged by the condensing lens onto the focal plane of the condensing lens is incident into the optical splitter 20 directly through the optical conductor 102. This is conducive to reducing a photon loss and improving photon collection efficiency. The optical conductor 102 may be a fused quartz optical conductor. The fused quartz optical conductor has good light conductivity and can reduce a loss of photons incident into the optical splitter 20, and this is conducive to improving the accuracy of discharge intensity calculation of the gas-insulated equipment.

Optionally, the embodiments of the present disclosure further provide gas-insulated equipment, including the PD detection apparatus for gas-insulated equipment in any embodiment of the present disclosure. The PD detection apparatus for gas-insulated equipment is disposed inside the gas-insulated equipment. Therefore, the gas-insulated equipment provided in the embodiments of the present disclosure also has the beneficial effects described in any embodiment of the present disclosure.

It should be noted that the above are only preferred embodiments of the present disclosure and the applied technical principles. Those skilled in the art will understand that the present disclosure is not limited to the specific embodiments described herein, and various obvious changes, adjustments and substitutions can be made by those skilled in the art, and do not depart from the protection scope of the present disclosure. Therefore, although the present disclosure has been described in detail by the above embodiments, the present disclosure is not limited to the above embodiments, and can also include more other equivalent embodiments without departing from the concept of the present disclosure, and the scope of the present disclosure is determined by the scope of the appended claims.

The invention claimed is:

1. A partial discharge (PD) detection apparatus for gas-insulated equipment, comprising a photon collector, an optical splitter, a first photoelectric conversion module, an ultraviolet fluorescent crystal, a second photoelectric conversion module, and a signal processing module, wherein
the photon collector is configured to collect optical radiation caused by PD of gas-insulated equipment;
an input terminal of the optical splitter is connected to the photon collector in a contact manner, and the optical splitter is configured to divide the collected optical radiation into first optical radiation and second optical radiation;

an input terminal of the first photoelectric conversion module is connected to a first output terminal of the optical splitter by a connection element, and the first photoelectric conversion module is configured to convert a first optical radiation signal into a first voltage signal;

a first terminal of the ultraviolet fluorescent crystal is connected to a second output terminal of the optical splitter by a connection element, a second terminal of the ultraviolet fluorescent crystal is connected to an input terminal of the second photoelectric conversion module in the contact manner, the ultraviolet fluorescent crystal is configured to convert a second optical radiation signal into an optical radiation signal of an ultraviolet fluorescence band, and the second photoelectric conversion module is configured to convert the optical radiation signal of the ultraviolet fluorescence band into a second voltage signal; and the signal processing module is electrically connected to an output terminal of the first photoelectric conversion module and an output terminal of the second photoelectric conversion module, and configured to calculate first apparent intensity of the first optical radiation based on the first voltage signal, calculate second apparent intensity of the second optical radiation based on the second voltage signal, and determine discharge intensity of the optical radiation based on a ratio of the second apparent intensity to the first apparent intensity.

2. The PD detection apparatus for gas-insulated equipment according to claim 1, wherein the first photoelectric conversion module comprises a first condensing collimating mirror, a first photodiode, and a first amplifier;

an input terminal of the first condensing collimating mirror is connected to the first output terminal of the optical splitter by a connection element, and an output terminal of the first condensing collimating mirror is connected to a control terminal of the first photodiode by an optical fiber; and a first terminal of the first photodiode is electrically connected to a first input terminal of the first amplifier, a second terminal of the first photodiode is electrically connected to a second input terminal of the first amplifier, the first photodiode is configured to convert the first optical radiation signal into a first photocurrent signal, and the first amplifier converts the first photocurrent signal into the first voltage signal.

3. The PD detection apparatus for gas-insulated equipment according to claim 1, wherein the second photoelectric conversion module comprises a second condensing collimating mirror, a second photodiode, and a second amplifier;

an input terminal of the second condensing collimating mirror is connected to the second terminal of the ultraviolet fluorescent crystal in the contact manner, and an output terminal of the second condensing collimating mirror is connected to a control terminal of the second photodiode by an optical fiber; and a first terminal of the second photodiode is electrically connected to a first input terminal of the second amplifier, a second terminal of the second photodiode is electrically connected to a second input terminal of the second amplifier, the second photodiode is configured to convert the optical radiation signal of the ultraviolet fluorescence band into a second photocurrent signal, and the second amplifier converts the second photocurrent signal into the second voltage signal.

4. The PD detection apparatus for gas-insulated equipment according to claim 3, wherein the second photodiode is an avalanche photodiode.

5. The PD detection apparatus for gas-insulated equipment according to claim 1, wherein both the first optical radiation and the second optical radiation are all-band optical radiation.

6. The PD detection apparatus for gas-insulated equipment according to claim 1, wherein the discharge intensity of the optical radiation is negatively correlated with the second apparent intensity.

7. The PD detection apparatus for gas-insulated equipment according to claim 1, wherein the photon collector comprises a condensing lens and an optical conductor; and the optical conductor is disposed on a focal plane of the condensing lens.

8. The PD detection apparatus for gas-insulated equipment according to claim 7, wherein the optical conductor is a fused quartz optical conductor.

9. The PD detection apparatus for gas-insulated equipment according to claim 1, wherein the signal processing module comprises an oscilloscope or an upper computer.

10. Gas-insulated equipment, comprising the PD detection apparatus for gas-insulated equipment according to claim 1.

11. Gas-insulated equipment, comprising the PD detection apparatus for gas-insulated equipment according to claim 2.

12. Gas-insulated equipment, comprising the PD detection apparatus for gas-insulated equipment according to claim 3.

13. Gas-insulated equipment, comprising the PD detection apparatus for gas-insulated equipment according to claim 4.

14. Gas-insulated equipment, comprising the PD detection apparatus for gas-insulated equipment according to claim 5.

15. Gas-insulated equipment, comprising the PD detection apparatus for gas-insulated equipment according to claim 6.

16. Gas-insulated equipment, comprising the PD detection apparatus for gas-insulated equipment according to claim 7.

17. Gas-insulated equipment, comprising the PD detection apparatus for gas-insulated equipment according to claim 8.

18. Gas-insulated equipment, comprising the PD detection apparatus for gas-insulated equipment according to claim 9.

* * * * *